United States Patent
Kim et al.

(10) Patent No.: US 7,434,589 B2
(45) Date of Patent: Oct. 14, 2008

(54) WAFER CLEANING APPARATUS WITH ANTICIPATING MALFUNCTION OF PUMP

(75) Inventors: Jung-min Kim, Suwon-si (KR); Man-young Lee, Hwaseong-gun (KR); Seung-kun Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 667 days.

(21) Appl. No.: 10/834,064

(22) Filed: Apr. 29, 2004

(65) Prior Publication Data

US 2004/0250838 A1 Dec. 16, 2004

(30) Foreign Application Priority Data

Jun. 12, 2003 (KR) .................. 10-2003-0037860

(51) Int. Cl.
*B08B 3/04* (2006.01)

(52) U.S. Cl. .................. 134/113; 134/186; 134/902

(58) Field of Classification Search .............. 134/113, 134/184, 186, 902
See application file for complete search history.

(56) References Cited

U.S. PATENT DOCUMENTS 5,968,268 A * 10/1999 Kitano et al. .............. 118/52
6,158,966 A * 12/2000 Guespin et al. ............ 417/46
6,318,386 B1 * 11/2001 Kamikawa et al. ........ 134/99.2
6,328,814 B1 * 12/2001 Fishkin et al. ............ 134/30

FOREIGN PATENT DOCUMENTS

| KR | 1999-009960 | 3/1999 |
|---|---|---|
| KR | 20-0292098 | 5/1999 |
| KR | 100247907 B1 | 12/1999 |

* cited by examiner

*Primary Examiner*—Joseph L Perrin
(74) *Attorney, Agent, or Firm*—Volentine & Whitt, PLLC

(57) ABSTRACT

Apparatus for and a method of cleaning or processing a wafer anticipates a malfunction of a pump and avoids an abrupt shutting down of the pump during the cleaning or processing of the wafer. The apparatus includes a tank vessel containing a liquid used in the cleaning or processing of the wafer, a pump that pumps the liquid chemical from the vessel, a filter that filters impurities contained in the liquid pumped by the pump, a heater that heats the filtered liquid to a predetermined temperature and supplies the heated liquid back into the tank vessel, and a pump malfunction anticipation unit that operates at the same time as the pump. The pump malfunction anticipation unit calculates the flow rate of the liquid pumped by the pump using a program, and based on the flow rate anticipates when it is time to replace the pump.

8 Claims, 3 Drawing Sheets

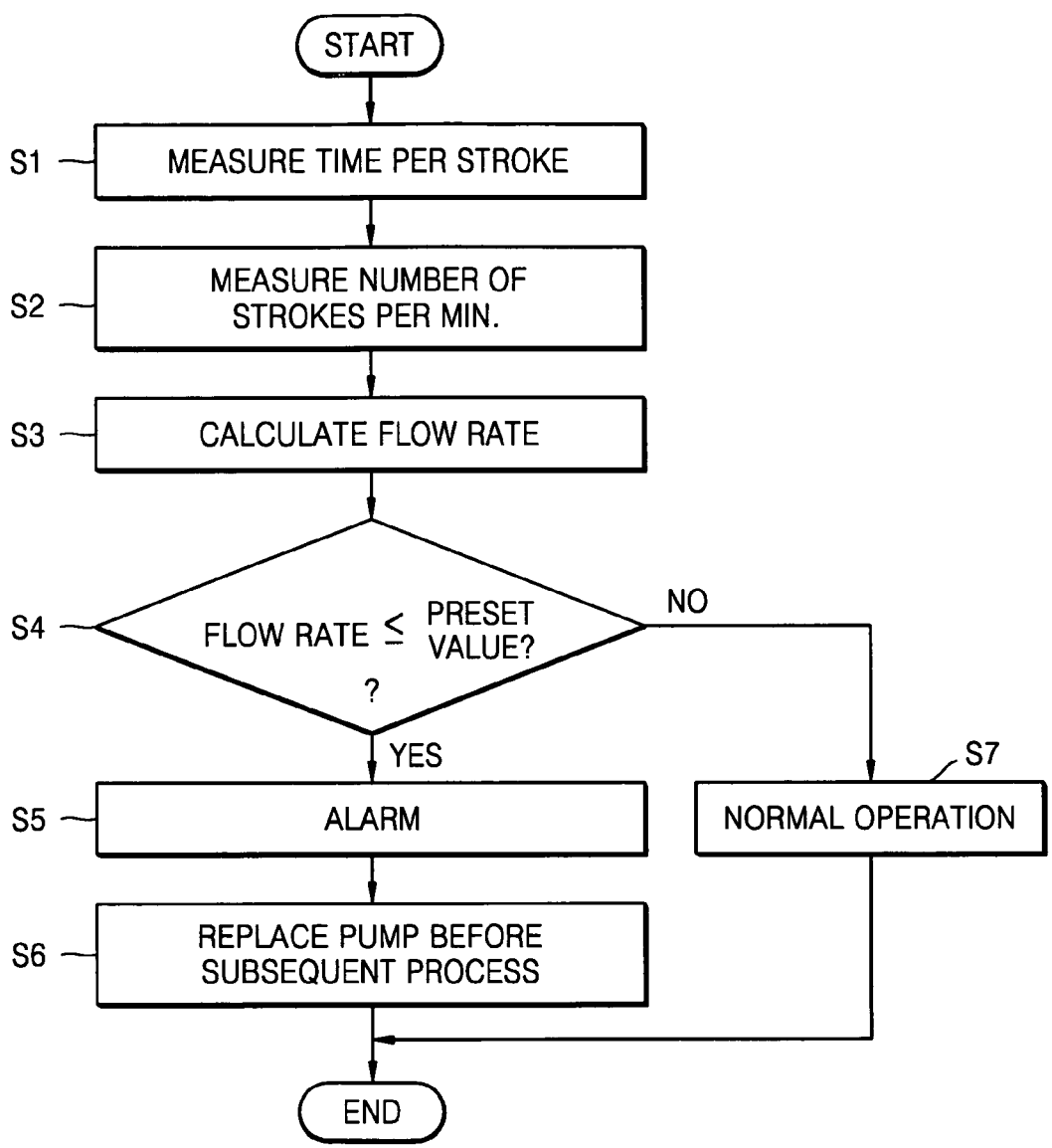

WAFER CLEANING APPARATUS WITH ANTICIPATING MALFUNCTION OF PUMP

BACKGROUND OF THE INVENTION

1. Field of the Invention

The present invention relates to an apparatus for and a method of cleaning or otherwise wet-treating a wafer. More particularly, the present invention relates to a cleaning/etching apparatus having an internal tank and an external tank that receives the cleaning/etching liquid that overflows the internal tank, and to the pumping of the cleaning/etching liquid from the external tank.

2. Description of the Related Art

The number of thin films formed on a wafer to manufacture a semiconductor device has been increasing to meet the demand for more highly integrated semiconductor devices. Thus, when semiconductor devices are manufactured, each thin film-forming process is followed by a process of cleaning the wafer to decrease the risk of defects and process malfunctions.

Generally, the wafer cleaning process entails dipping the wafer into a chemical solution or deionized water (hereinafter, cleaning liquid) such that metallic impurities, organic contaminants, or native oxides are removed from the surface of the wafer.

A conventional cleaning apparatus for performing the cleaning process comprises a cleaning tank containing the cleaning liquid into which the wafer is dipped, and a pump that pumps the liquid chemical from the cleaning tank. The pump includes a bellows which moves axially from side to side to pump the cleaning liquid, and right and left sensors disposed at both sides of the pump. The sensors are operative to turn on and off according to the reciprocating movement of the bellows. In the conventional cleaning apparatus, a determination of whether the pump is operating normally is made based on the time interval at which the right and left sensors are turned on and off. That is, if the time interval at which the right and left sensors are turned on is longer or shorter than a preset time interval, the pump is considered to be malfunctioning and the operation of the wafer cleaning apparatus including that of the pump is shut down.

However, if the operation of the wafer cleaning apparatus is abruptly shut down, the cleaning process may be stopped while wafers are submerged in the cleaning liquid in the cleaning tank. As a result, impurities remaining in the liquid may be absorbed into the surface of the wafer. Also, if the wafers are being wet etched using the cleaning apparatus, the wafers will not be etched by the desired amount.

SUMMARY OF THE INVENTION

According to an aspect of the present invention, there is provided a wafer cleaning or similar processing apparatus comprising a tank vessel containing a liquid for use in cleaning/processing a wafer dipped in the liquid, a pump that pumps the liquid from the vessel, and a pump malfunction anticipation unit that operates at the same time as the pump, calculates the flow rate of the liquid pumped by the pump according to a program, and based on the calculation anticipates when it is time to replace the pump.

The apparatus may also include a filter that filters impurities contained in the liquid after the liquid is pumped out of the tank vessel, and a heater that heats the filtered liquid to a predetermined temperature and from which the liquid is returned to the tank vessel.

According to yet another aspect of the present invention, there is provided a method of cleaning or otherwise treating a wafer wherein a liquid is supplied into a tank vessel, and a wafer is dipped into the liquid contained in the vessel. A pump connected to the vessel is driven to pump liquid from the tank vessel while the wafer is submerged in the liquid and the liquid is being supplied into the vessel. At this time, the flow rate of the liquid that is being pumped by the pump is calculated. The calculated flow rate is compared with a preset value. A warning indicative of an anticipated malfunction of the pump is issued when the calculated flow rate is lower than the preset value. On the other hand, the wafer is removed from the tank vessel and another wafer into the liquid in the vessel if the flow rate is higher than the preset value, i.e., a subsequent treatment process is carried out.

The preset value is 5%~10% higher than the minimum flow rate characteristic of the pump during its normal operating state. Accordingly, the current process can be completed before the pump needs to be shutdown and replaced.

BRIEF DESCRIPTION OF THE DRAWINGS

The above and other features and advantages of the present invention will become more apparent from the following detailed description of the preferred embodiments thereof made with reference to the attached drawings, in which:

FIG. 3 is a flowchart illustrating a method of anticipating the malfunctioning of a pump according to the present invention.

DETAILED DESCRIPTION OF THE PREFERRED EMBODIMENTS

Figure 1:
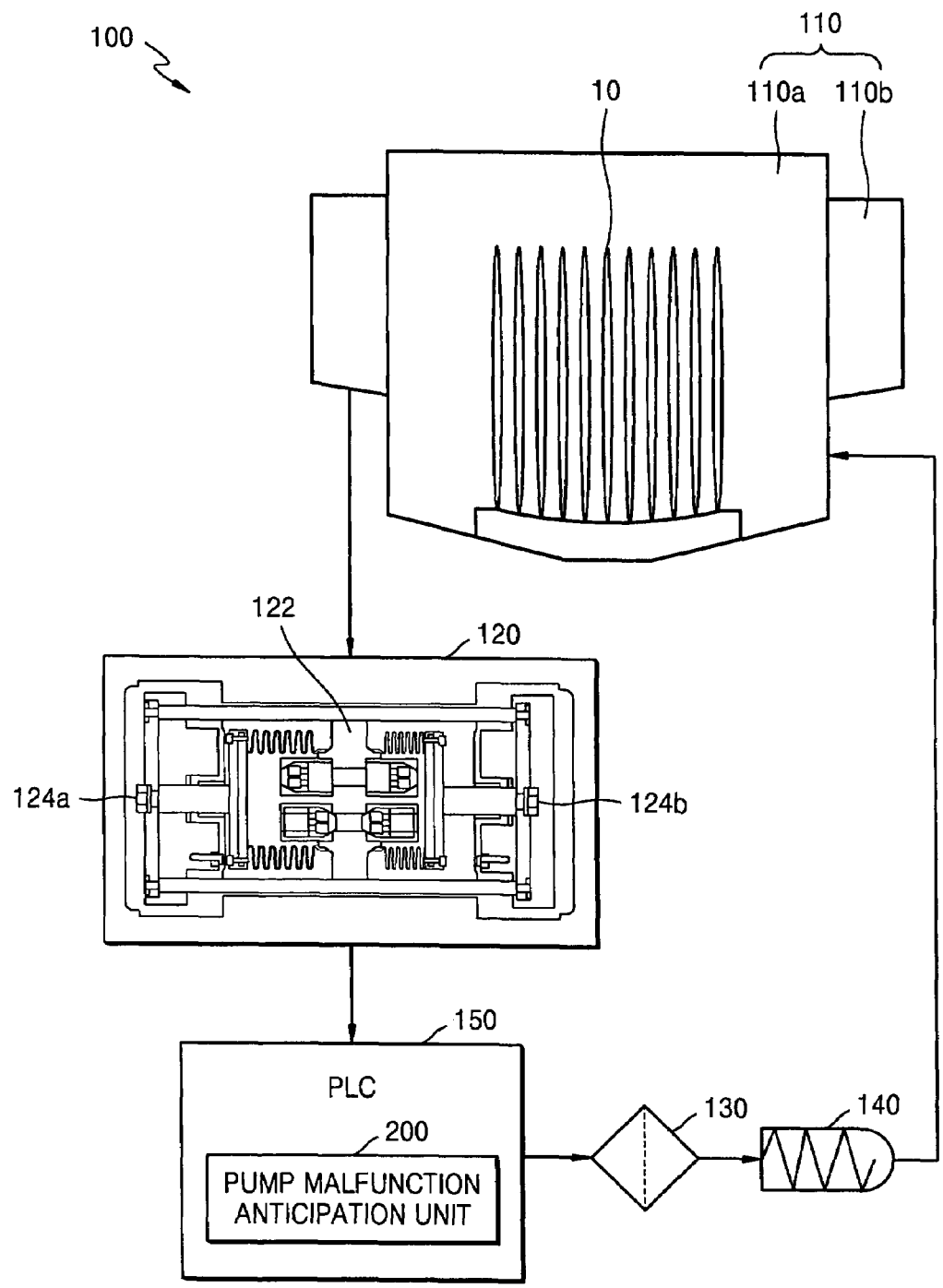
FIG. 1 is a schematic diagram of a wafer cleaning apparatus according to the present invention.

Referring to FIG. 1, a wafer cleaning apparatus 100 is a circulation system that comprises a cleaning tank (vessel) 110, a pump 120, a filtering unit 130, and a heating unit 140. Also, the wafer cleaning apparatus 100 includes a programmable logic controller (PLC) 150 that controls the operations of the wafer cleaning apparatus 100 and the pump 120. The PLC 150 includes a pump malfunction anticipation unit 200 that anticipates and prevents a malfunction of the pump 120.

More specifically, the cleaning tank 110 comprises an internal tank 110a and an external tank 110b that surrounds the internal tank 110a. A plurality of wafers 10 are cleaned by a cleaning liquid fed into the internal tank 110a, and the external tank 110b stores the liquid that overflows from the internal tank 110a. Thus, the liquid stored in the external tank 110b may contain impurities that have been removed form the wafers by the cleaning liquid in the internal tank 110a.

The pump 120 pumps the cleaning liquid from the external tank 110b. The pump 120 comprises a reciprocating mechanism in the form of a bellows 122 that reciprocates from side to side to create the pumping action that induces the liquid from the external tank 110b, and left and right sensors 124a and 124b disposed at both sides of the pump as faced towards opposite sides of the bellows 122. The left and right sensors 124a and 124b are proximity sensors actuated by the reciprocating movement of the bellows 122. That is, when the bellows 122 moves to the left, the left sensor 124a is actuated (turned on or off) by the bellows, and when the bellows 122 moves to the right, the right sensor 124b is actuated (turned on or off).

The filtering unit 130 filters the impurities contained in the liquid that is pumped by the pump 120.

The heating unit 140 heats the filtered liquid to a temperature under which the cleaning liquid provides an optimum cleaning effect. The liquid heated by the heating unit 140 is supplied to the internal tank 110a of the cleaning tank 110.

Figure 2:
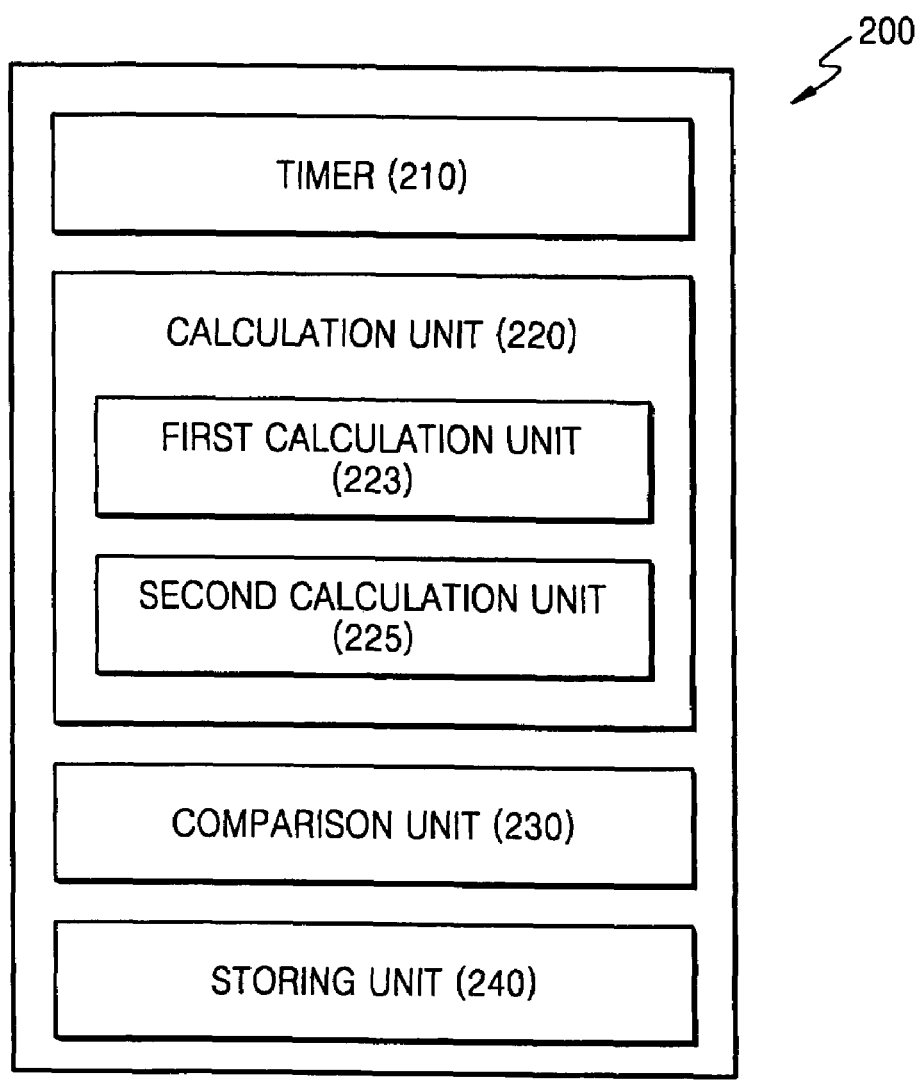
FIG. 2 is a block diagram of the pump malfunction anticipation unit of the apparatus shown in FIG. 1.

The PLC 150 controls the overall operations of the wafer cleaning apparatus 100 and the pump 120. The programmable pump malfunction anticipation unit 200 of the PLC 150 calculates the flow rate of the liquid chemical pumped by the pump 120 and anticipates whether the pump 120 is about to malfunction. The pump malfunction anticipation unit 200 is driven by the pump 120, and comprises a timer 210, a calculation unit 220, a comparison unit 230, and a storing (memory) unit 240, as shown in FIG. 2.

The timer 210 measures the time per stroke of the pump. The time per stroke corresponds to the interval between the time at which the left sensor 124a (or the right sensor 124b) is turned off and then the right sensor 124b (the left sensor 124a) is turned on by the bellows 122.

The calculation unit 220 comprises a first calculation unit 223 and a second calculation unit 225. The first calculation unit 223 calculates the number of strokes per minute based on the time per stroke measured by the timer 210. The second calculation unit 225 calculates the flow rate of the liquid pumped by the pump 120 (hereinafter, units per minute) based on the number of strokes per minute calculated by the first calculation unit 223. Typically, the volume per stroke of the pump 120 is a fixed characteristic of the pump. Therefore, the second calculation unit 225 calculates the flow rate by multiplying the number of strokes per minute by the fixed volume of flow per stroke.

The comparison unit 230 compares a preset value, i.e., a value corresponding to the flow rate during a normal operation of the pump, with the flow rate calculated by the second calculation unit 156. The preset value is stored in the storing (memory) unit 240. Also, the storing (memory) unit 240 can store other data such as the time intervals measured by the timer 210 and the values calculated by the calculation unit 220.

The above-described wafer cleaning apparatus 100 further comprises an alarm (not shown) that warns a user of a malfunction of the pump 120.

The operation of the wafer cleaning apparatus 100 is as follows.

A wafer 10 is dipped into a cleaning liquid contained in the internal tank 110a and is cleaned by the liquid. While the wafer 10 is being cleaned, impurity-free cleaning liquid is continuously supplied to the internal tank 110a, and the used cleaning liquid overflows the external tank 110a into the external tank 110b. The pump 120 pumps the cleaning liquid from the external tank 110b using the reciprocating movement of the bellows 122.

Also, the pump malfunction anticipation unit 200 of the PLC 150 operates at the same time as the pump 120. The operation of the pump malfunction anticipation unit 200 will now be described with reference to FIG. 3.

As the pump 120 operates, the bellows 122 reciprocates from side to side. Thus, the left and right sensors 124a and 124b are actuated, and the timer 210 of the pump malfunction anticipation unit 200 measures the time per stroke according to the actuation of the left and right sensors 124a and 124b (S1).

Next (S2), the first calculation unit 223 measures the number of strokes per minute based on the time per stroke measured by the timer 210. The number of strokes per minute is obtained by dividing sixty by the number of seconds per stroke.

Next, the second calculation unit 225 calculates the flow rate (unit volume of flow per minute) based on the number of strokes per minute calculated by the first calculation unit 223 (S3) in the manner described above.

The comparison unit 230 then compares the flow rate with a preset value based on the characteristic flow rate of the pump (S4). The preset value is slightly higher (e.g., 5%~10% higher) than the minimum flow rate that is provided by the pump during its normal operation, i.e., according to the working range of specifications of the pump. This provides a margin of time before a user is warned of the imminent malfunction of the pump 120, and allows the current cleaning process to be completed before the pump is shut down.

That is, when the result of the comparison is that the flow rate is less than or equal to the preset value, the comparison unit 230 anticipates a malfunction of the pump 12O, such as that which will occur when there is a leak in the pump 120, and operates an alarm (S5). Subsequently (S6), the current cleaning process is completed, and the pump 120 is replaced with a new one or is repaired before the next cleaning process begins. If, on the other hand, the measured flow rate is higher than the preset valve, the pump 120 is deemed to be operating in an acceptable manner. Thus, the cleaning apparatus continues to operate normally (S7).

As described above, the wafer cleaning apparatus of the present invention comprises the pump malfunction anticipation unit that operates at the same time as the pump and calculates the flow rate of the pump. The pump malfunction anticipation unit anticipates a malfunction of the pump in good time to replace the pump before the processing errors occur. The pump malfunction anticipation unit also serves to monitor the pump so that the pump is not abruptly shutdown by the PLC during a cleaning process. Thus, the present invention obviates such problems as wafer contamination and over-etching, which otherwise may occur if the wafer cleaning apparatus is abruptly shut down.

Finally, although the present invention has been particularly shown and described in connection with the preferred embodiments thereof, various changes in form and details may be made thereto without departing from the true spirit and scope of the present invention as defined by the following claims.

What is claimed is:

1. A wafer treating apparatus comprising:
    a tank vessel for use in containing liquid into which a wafer is dipped;
    a pump connected to said tank vessel for pumping liquid from the tank vessel; and
    a pump malfunction anticipation unit operatively connected to said pump so as to operate at the same time as the pump, said pump malfunction anticipation unit include a calculator configured to calculate the flow rate of liquid being pumped by the pump, and a comparator that compares the flow rate calculated by said calculator with a preset value, whereby a malfunctioning of the pump can be anticipated,
    wherein said pump comprises a bellows that reciprocates from side to side in the pump to create a pumping action that pumps the liquid from said tank vessel, and a left proximity sensor and a right proximity sensor disposed at both sides of the pump, such that said left proximity sensor is actuatable when the bellows moves proximate said left proximity sensor, and said right proximity sensor is actuatable when the bellows moves proximate said right proximity sensor.

2. The apparatus of claim 1, and further comprising a programmable logic controller operatively connected to said pump for controlling the driving of the pump, and wherein the pump malfunction anticipation unit is an integral part of the programmable logic controller.

3. The apparatus of claim 1, wherein the pump malfunction anticipation unit further comprises a timer that measures the time per stroke of the pump based on the actuation of said left and right sensors, and a memory device that stores said preset value, said calculator being operatively connected to said timer so as to calculate the flow rate of the liquid pumped by the pump based on the time per stroke measured by the timer, and said comparator being operatively connected to said memory device.

4. The apparatus of claim 3, wherein said pump can pump the liquid over a working range of flow rates that is characteristic of the pump during its normal operating state, wherein a lowest flow rate among said working range of flow rates is a minimum flow rate said pump during its normal operating state, and said preset value is 5%~10% higher than said minimum flow rate.

5. The apparatus of claim 1, and further comprising a filtering unit disposed downstream of and connected to the pump to filter the liquid pumped by the pump, and a heating unit connected to said filtering unit and to said tank vessel and comprising a heater that heats the liquid filtered by said filter, whereby the heated liquid is supplied to said tank vessel.

6. The apparatus of claim 5, wherein said tank vessel comprises an internal tank dedicated to contain the liquid and sized to receive the wafers as submerged in the liquid, and an external tank that surrounds said internal tank so as to receive liquid that overflows from the internal tank, said pump being connected to said external tank so as to pump the liquid therefrom.

7. The apparatus of claim 1, wherein said tank vessel comprises an internal tank dedicated to contain the liquid and sized to receive the wafers as submerged in the liquid, and an external tank that surrounds said internal tank so as to receive liquid that overflows from the internal tank, said pump being connected to said external tank so as to pump the liquid therefrom.

8. The apparatus of claim 1, wherein the pump is a positive displacement pump, and the pump malfunction anticipation unit further comprises a timer that measures the time per stroke of the pump, and a memory device that stores said preset value, said calculator being operatively connected to said timer so as to calculate the flow rate of the liquid pumped by the pump by multiplying a value representing the time per stroke measured by the timer by a value representing the volume of liquid displaced by the pump per stroke of the pump, and said comparator being operatively connected to said memory device.

\* \* \* \* \*